(12) United States Patent
Adam et al.

(10) Patent No.: US 7,521,772 B2
(45) Date of Patent: Apr. 21, 2009

(54) MONOCRYSTALLINE EXTRINSIC BASE AND EMITTER HETEROJUNCTION BIPOLAR TRANSISTOR AND RELATED METHODS

(75) Inventors: Thomas N Adam, Poughkeepsie, NY (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 11/557,692

(22) Filed: Nov. 8, 2006

(65) Prior Publication Data

US 2008/0121930 A1 May 29, 2008

(51) Int. Cl.
*H01L 29/00* (2006.01)
(52) U.S. Cl. .................. 257/517; 257/197; 257/526; 257/565; 257/E29.044
(58) Field of Classification Search ........... 257/197, 257/517, 526, 547, 552, 565, 616, E29.033, 257/E29.034, E29.044
See application file for complete search history.

(56) References Cited

U.S. PATENT DOCUMENTS

| | | | | |
|---|---|---|---|---|
| 6,177,717 | B1 * | 1/2001 | Chantre et al. | 257/565 |
| 6,682,992 | B2 * | 1/2004 | Geiss et al. | 438/488 |
| 6,888,221 | B1 * | 5/2005 | Joseph et al. | 257/565 |
| 2007/0298578 | A1 * | 12/2007 | Khater et al. | 438/322 |

* cited by examiner

*Primary Examiner*—Matthew E Warren
(74) *Attorney, Agent, or Firm*—Todd M. C. Li; Hoffman Warnick LLC

(57) ABSTRACT

A heterostructure bipolar transistor (HBT) and related methods are disclosed. In one embodiment, the HBT includes a heterostructure bipolar transistor (HBT) including: a substrate; a monocrystalline emitter atop the substrate; a collector in the substrate; at least one isolation region adjacent to the collector; a monocrystalline silicon germanium (SiGe) intrinsic base extending over each isolation region; and a monocrystalline silicon extrinsic base. A method may include forming the intrinsic and extrinsic base and the emitter as monocrystalline, with the extrinsic base (and emitter) formed in a self-aligned fashion utilizing selective-epitaxial growth on porous silicon. As a result, some mask levels can be omitted, making this an inexpensive alternative to conventional processing.

5 Claims, 15 Drawing Sheets

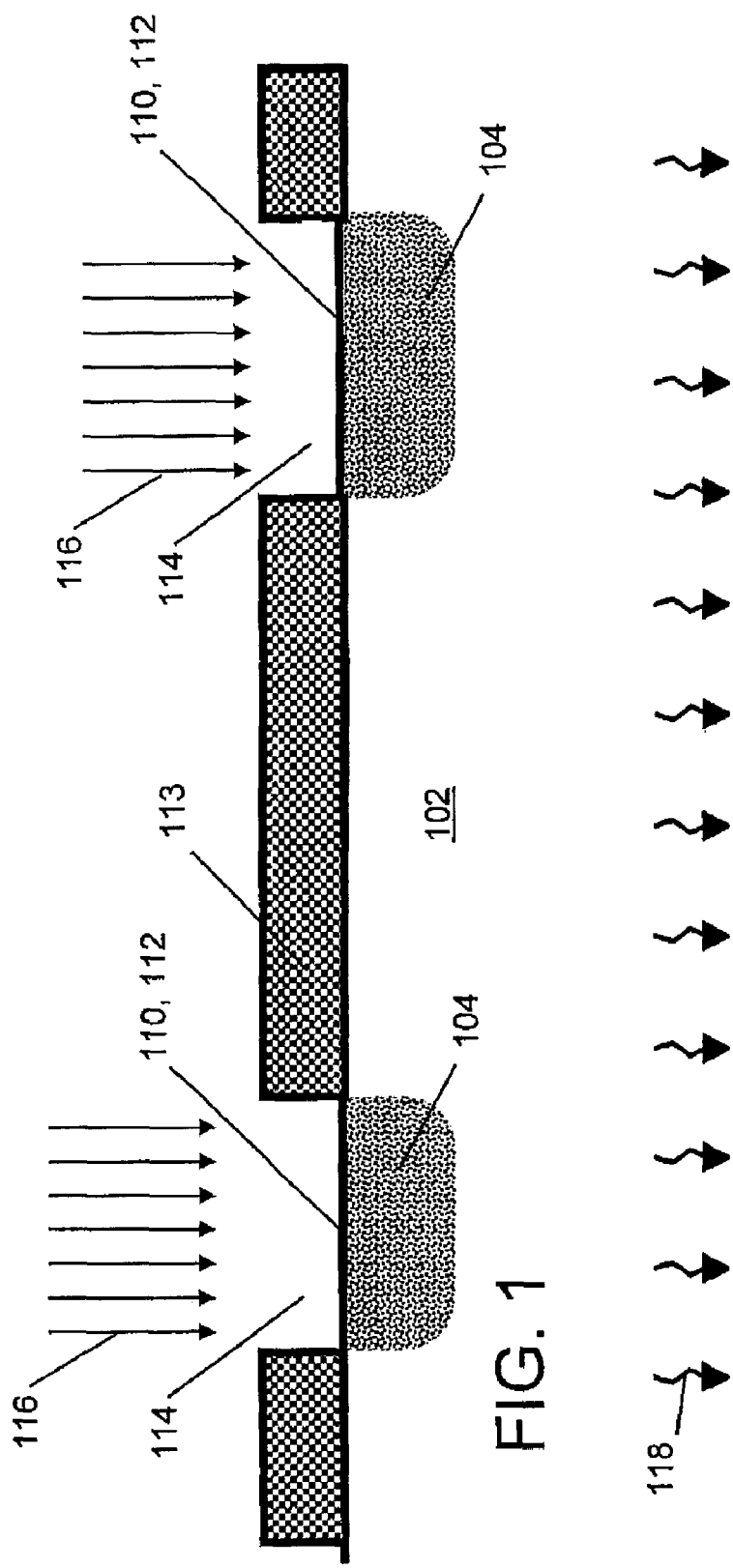

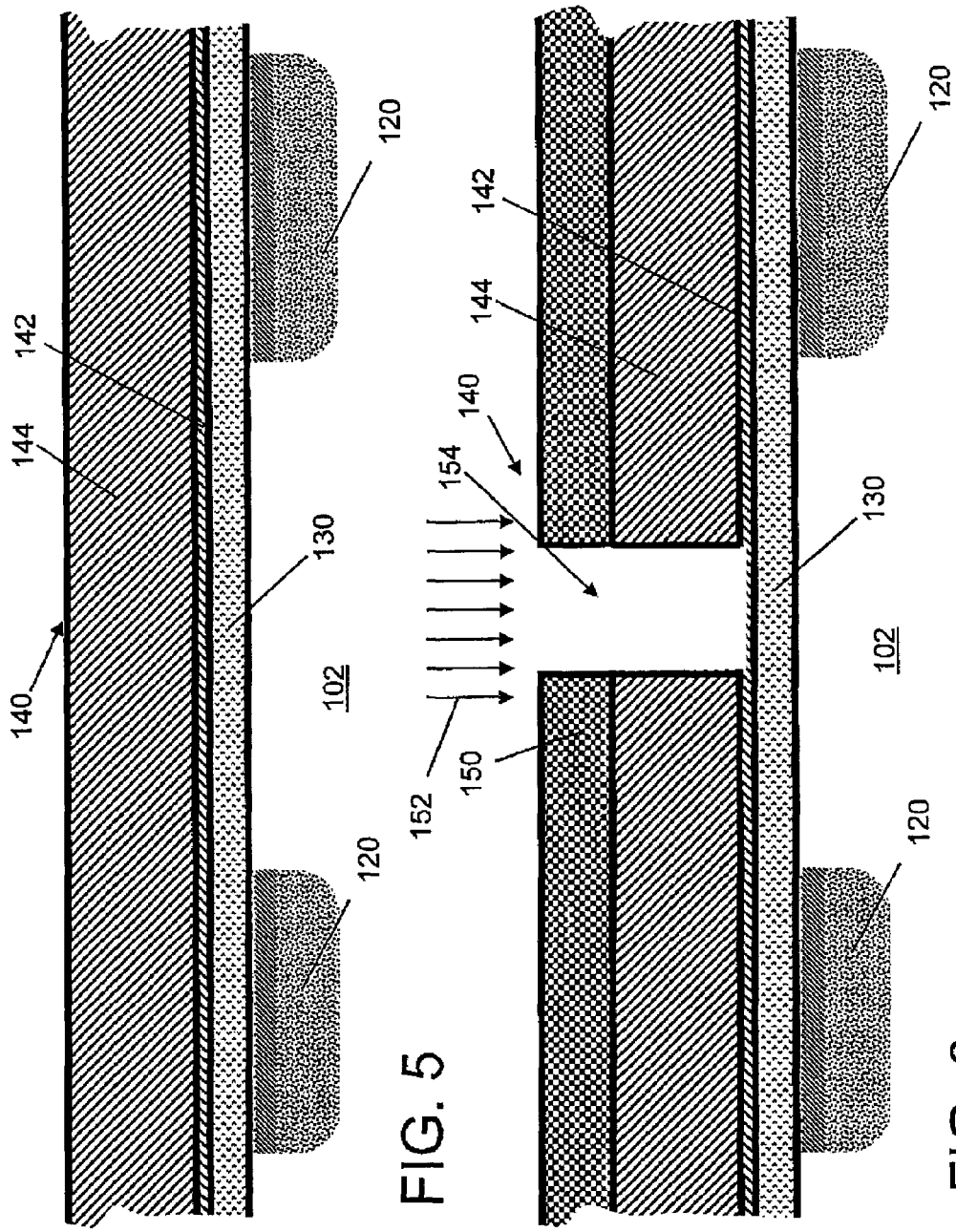

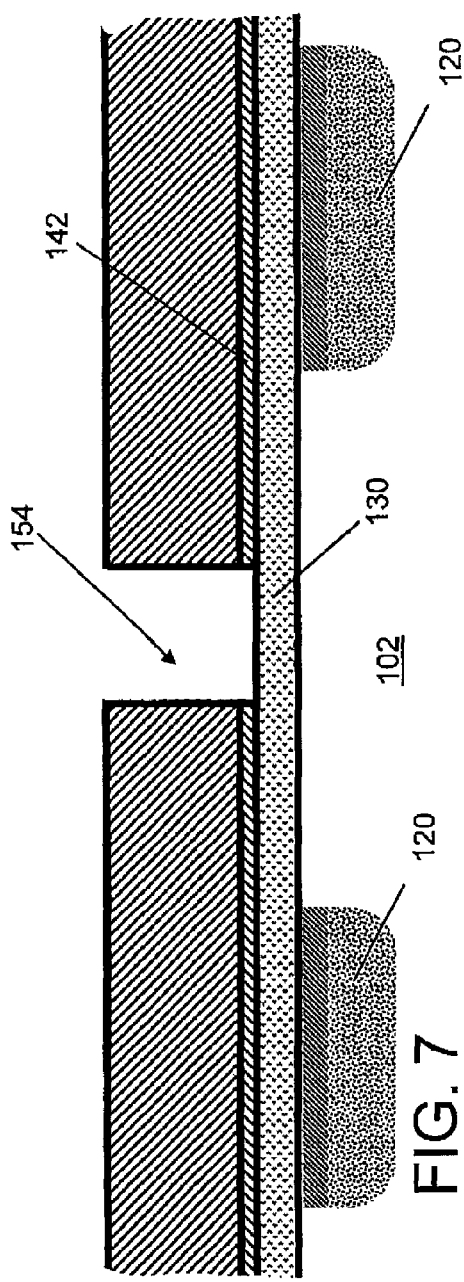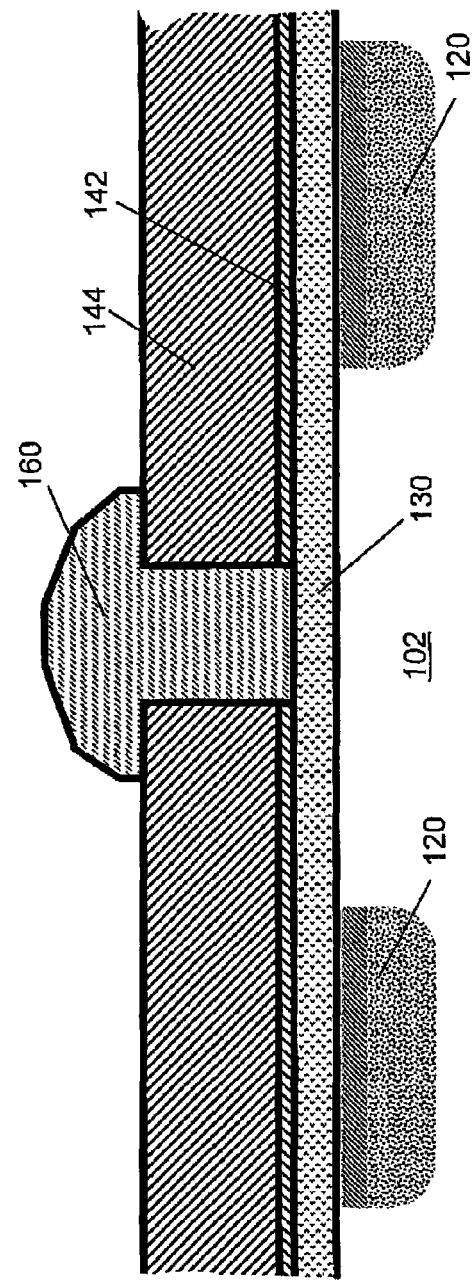

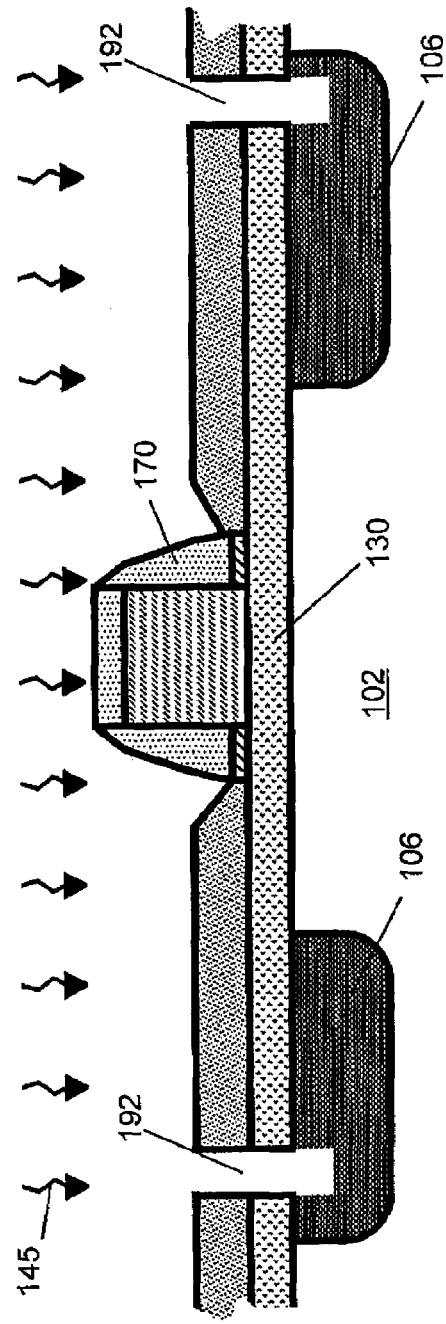
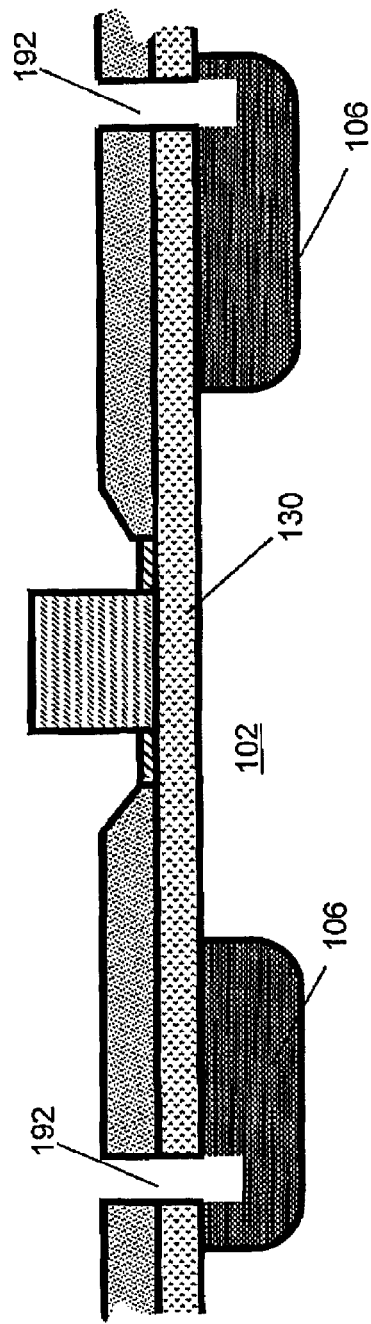
FIG. 13
FIG. 14

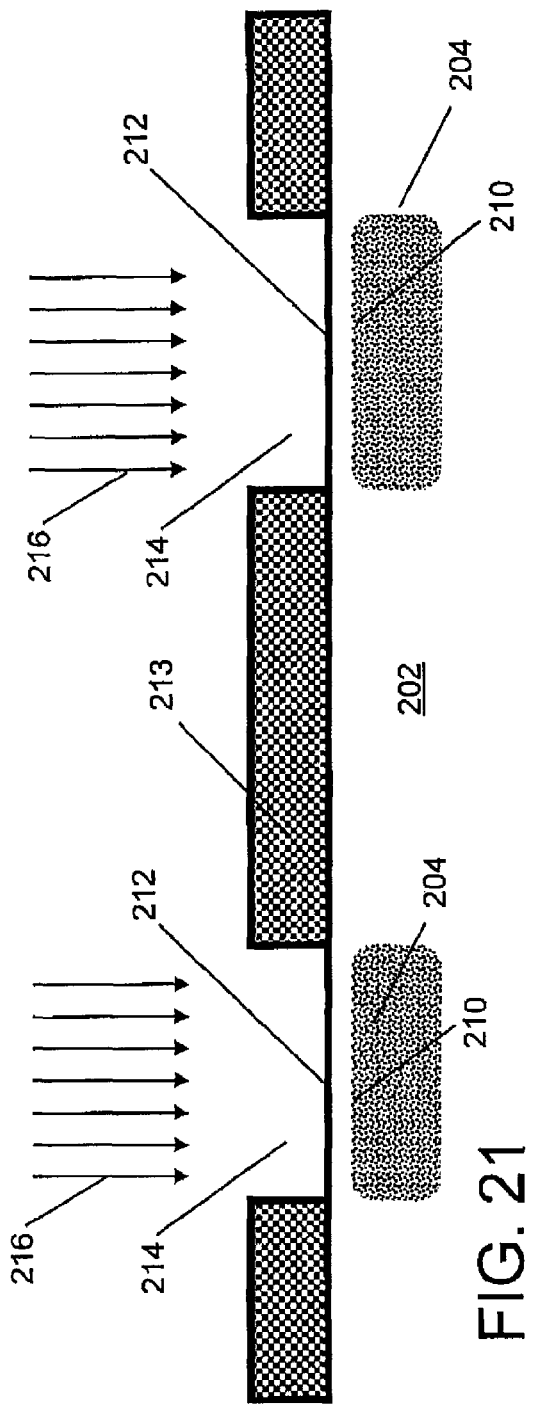
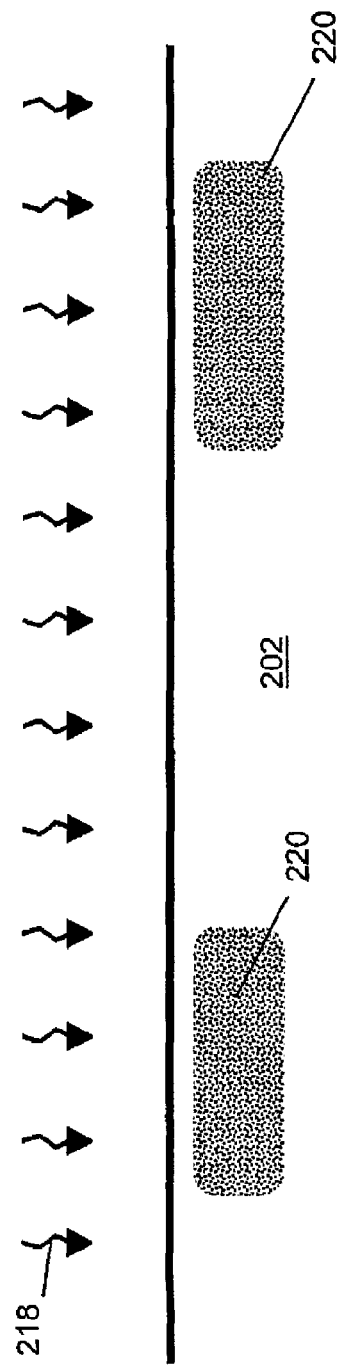
FIG. 21
FIG. 22

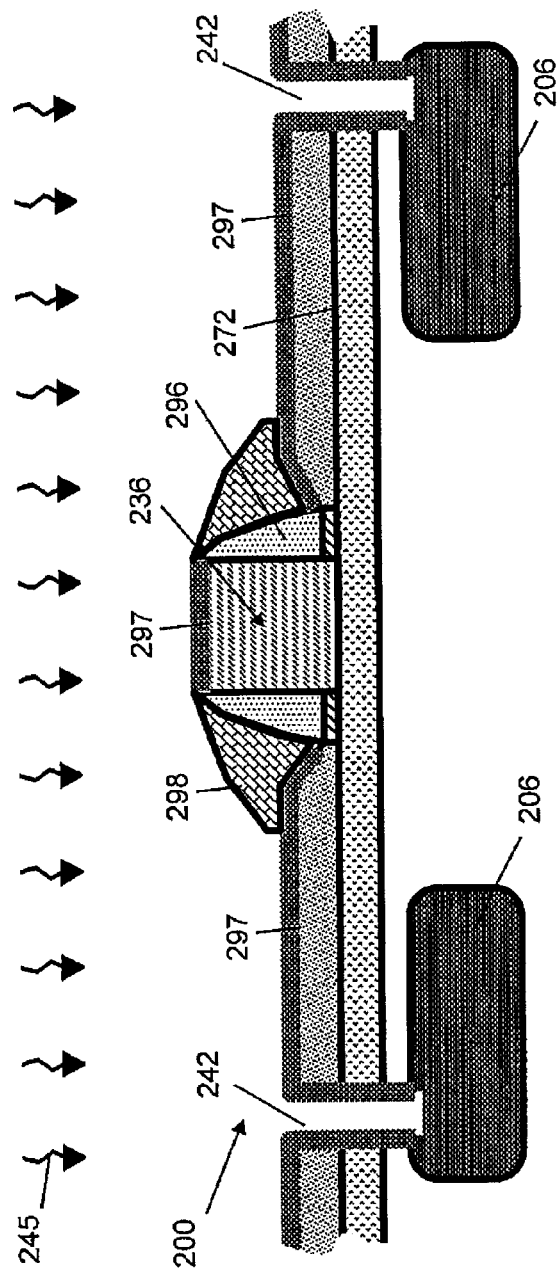
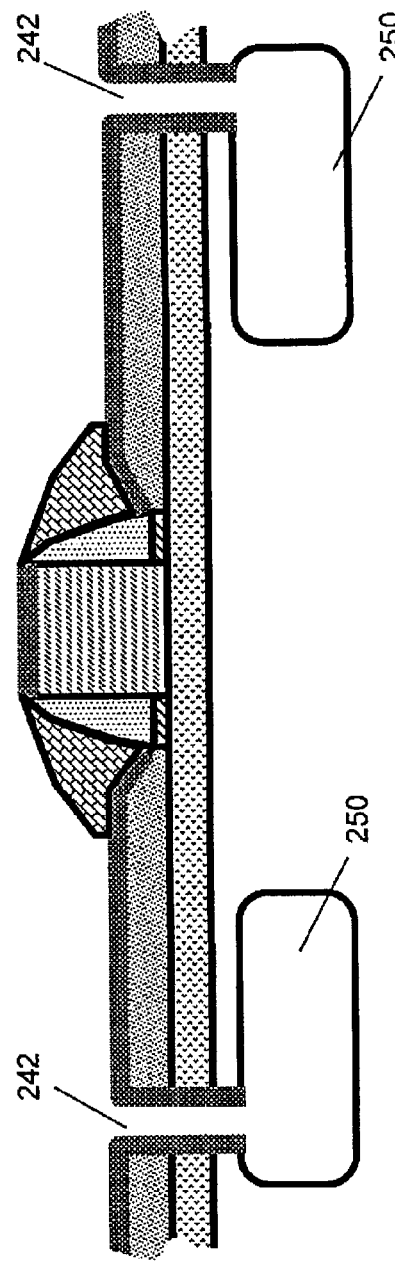
FIG. 25
FIG. 26

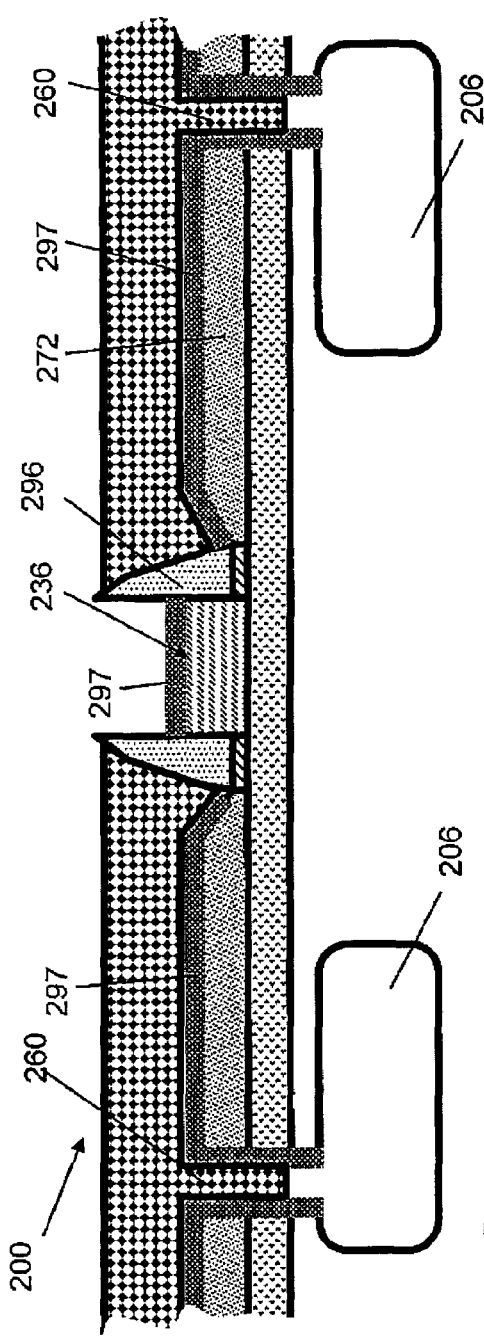
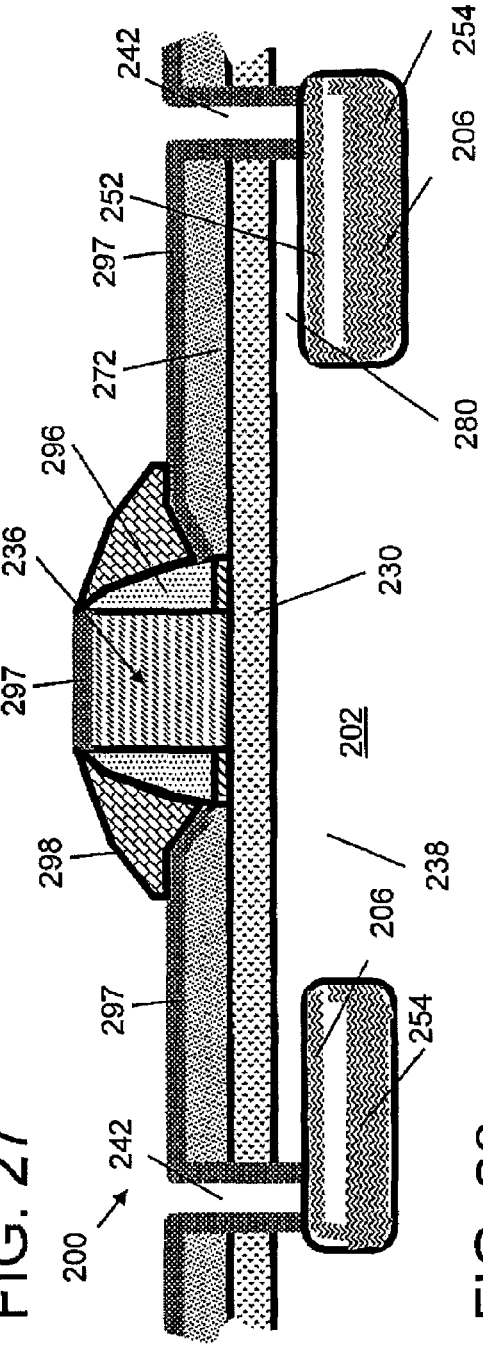
FIG. 27
FIG. 28

MONOCRYSTALLINE EXTRINSIC BASE AND EMITTER HETEROJUNCTION BIPOLAR TRANSISTOR AND RELATED METHODS

BACKGROUND OF THE INVENTION

1. Technical Field

The invention relates generally to integrated circuit (IC) chip fabrication, and more particularly, to a heterojunction bipolar transistor (HBT) with a monocrystalline base and emitter and methods related thereto.

2. Background Art

Silicon germanium (SiGe) heterostructure bipolar transistors (HBT) are high performance transistor structures used widely in high-speed integrated circuit (IC) chips. Advancement of SiGe HBT technology, however, is hindered by a number of challenges. For example, to meet costumer demands and market trends toward higher speeds and lower power consumption, devices are scaled, i.e. reduced in size. Consequently, small lithographic printing dimensions and the ability to align mask levels with extreme precision are required. Even small misalignments and device size increases result in performance degradation due to increased overlap capacitances, even device failure. In addition, current high-performance HBT technologies are expected to exhibit a larger statistical spread in key parameters due to minute lithographic variations. These key parameters include, for example, base resistance (Rb), threshold frequency (Ft), maximum frequency (Fmax), etc. Conventionally, all of the regions of the HBT (e.g., emitter, collector, base) are generated using non-self-aligned photolithography techniques. These known approaches result in problems such as emitter and base mis-alignment and non-planarity, a discontinuous polycrystalline intrinsic base resulting in a polycrystalline extrinsic base, etc. As a result, high performance SiGe HBTs are becoming harder to fabricate because of issues related to advanced scaling of dimensions. In order to address the above-described problems and allow for future scaling of HBTs, self-alignment integration schemes are desired. Unfortunately, conventional self-alignment techniques are inadequate to address the above-described problems.

SUMMARY OF THE INVENTION

A heterostructure bipolar transistor (HBT) and related methods are disclosed. In one embodiment, the HBT includes a heterostructure bipolar transistor (HBT) comprising: a substrate; a monocrystalline emitter atop the substrate; a collector in the substrate; at least one isolation region adjacent to the collector; a monocrystalline silicon germanium (SiGe) intrinsic base extending over each isolation region; and a monocrystalline silicon extrinsic base. A method may include forming the intrinsic and extrinsic base and the emitter as monocrystalline, with the extrinsic base (and emitter) formed in a self-aligned fashion utilizing selective-epitaxial growth on porous silicon. As a result, some mask levels can be omitted, making this an inexpensive alternative to conventional processing.

A first aspect of the invention provides a method of forming a heterostructure bipolar transistor (HBT), the method comprising: providing a substrate; forming an implanted region in the substrate; forming a monocrystalline silicon germanium (SiGe) intrinsic base over the implanted region and the substrate; forming a monocrystalline emitter over the monocrystalline SiGe intrinsic base; forming a self-aligned monocrystalline extrinsic base over the monocrystalline SiGe intrinsic base; and converting the implanted region to an isolation region.

A second aspect of the invention provides a heterostructure bipolar transistor (HBT) comprising: a substrate; a monocrystalline emitter atop the substrate; a collector in the substrate; at least one isolation region adjacent to the collector; a monocrystalline silicon germanium (SiGe) intrinsic base extending over each isolation region; and a monocrystalline silicon extrinsic base.

A third aspect of the invention provides a method of forming a heterostructure bipolar transistor (HBT), the method comprising: providing a substrate; forming an implanted region in the substrate; forming a monocrystalline silicon germanium (SiGe) intrinsic base over the implanted region and the substrate; forming a monocrystalline emitter over the monocrystalline SiGe intrinsic base, the monocrystalline emitter having a substantially plug-shape; forming a self-aligned monocrystalline extrinsic base over the monocrystalline SiGe intrinsic base; converting the implanted region to an isolation region; and recessing the monocrystalline emitter.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1-17 show one embodiment of a method of forming an HBT, with FIG. 17 showing one embodiment of an HBT.

FIGS. 21-25 show another alternative embodiment of the method.

FIGS. 26-27 show another alternative embodiment of the method.

FIG. 28 shows another alternative embodiment of the method.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 3:
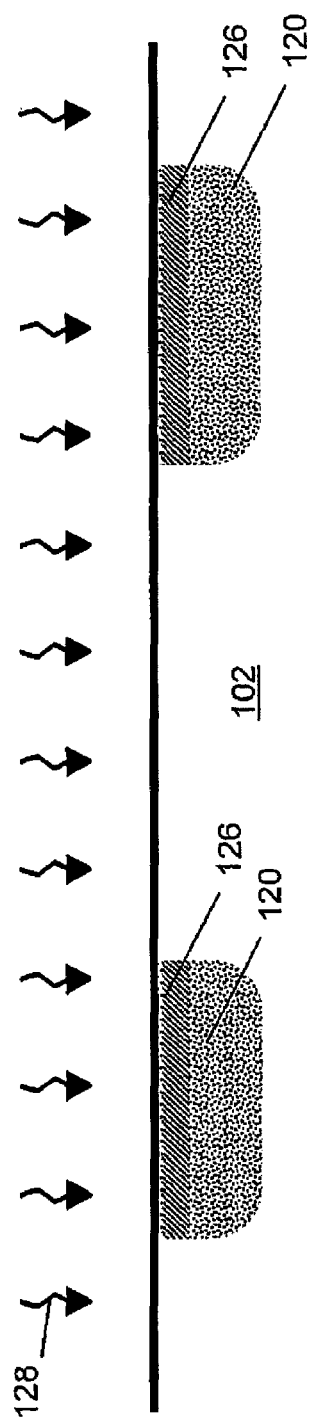

Turning to the drawings, FIGS. 1-29 show various embodiments of a method, and in particular, a method of forming a heterostructure bipolar transistor (HBT) 100, 200 (FIGS. 17, 25 and 27-29).

FIGS. 1-17 show one embodiment of the method. FIG. 1 shows providing a substrate 102. Substrate 102 may include but is not limited to: silicon or silicon germanium, in the form of a bulk, semiconductor-on-insulator (SOI), or virtual substrate (relaxed SiGe). In any case, substrate 102 is monocrystalline. FIG. 1 also shows one embodiment of forming an implanted region 104 (two shown) in substrate 102, which will ultimately become isolation region 106 (FIG. 13), as described herein. Implanted region 104 includes an upper surface 110 capable of having monocrystalline silicon formed thereon. In this case, implanted region 104 includes the monocrystalline silicon (now doped) of substrate 102. Implanted region 104 may be formed, for example, by forming a mask 113 and patterning/etching to form an opening 114 therein, and then ion implanting 116. The dopant implanted may include, for example, boron (B). In this embodiment, upper surface 110 of implanted region 104 is substantially co-planar with a surface 112 of substrate 102, i.e., ion implanting 116 uses sufficient power to provide a shallow implant from upper surface 110.

FIG. 2 shows removing mask 113 (FIG. 1) and performing an anodic porousification 118 on implanted region 104 (FIG. 1) to form implanted porous silicon regions 120. The mask removal may include any conventional resist stripping technique, e.g., wet etching. Anodic porousification 118 may include performing a hydrofluoric acid bath using low current densities, e.g., approximately 1-10 mA/cm$^2$.

Next, as shown in FIG. 3, upper surface 110 (FIG. 1) is formed into a monocrystalline silicon film 126 by annealing 128, e.g., at a high temperature in the range of approximately 1000-1200° C. in a reduced pressure hydrogen environment.

Figure 4:
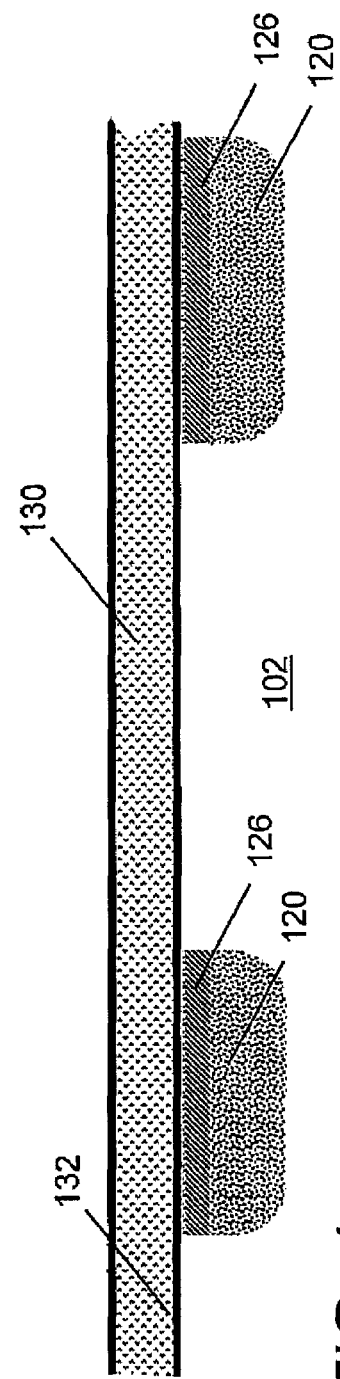
Figure 17:
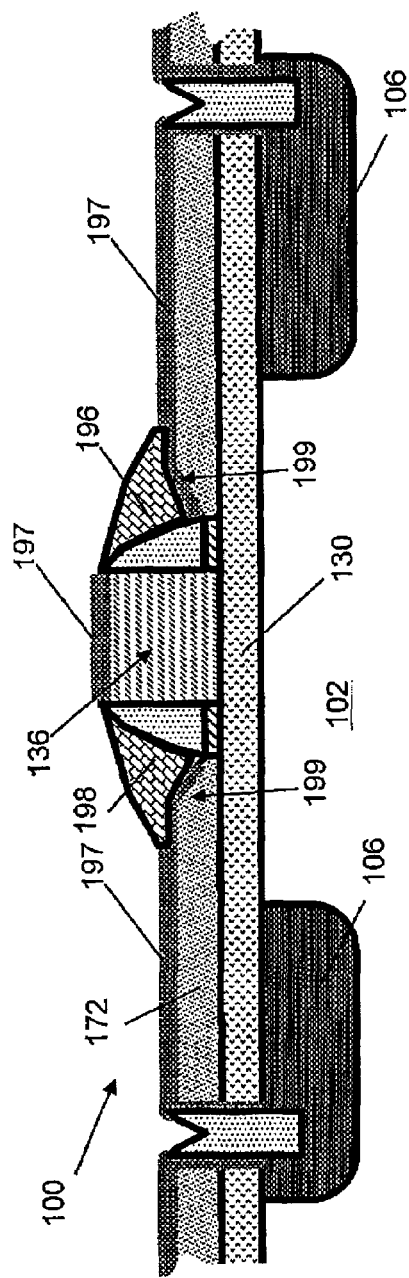

FIG. 4 shows forming a monocrystalline silicon germanium (SiGe) intrinsic base 130 over implanted porous silicon region 120 and substrate 102. This process may be preceded by patterning a hardmask (not shown) to define a region for HBT 100 (FIG. 17). In any event, in contrast to conventional processes, monocrystalline SiGe intrinsic base 130 is substantially uniform in thickness and substantially continuous, even over implanted porous silicon region 120. In addition, monocrystalline SiGe intrinsic base 130 is monocrystalline SiGe over implanted porous silicon region 120, which will eventually be converted to an isolation region 106 (FIG. 17). Monocrystalline SiGe intrinsic base 130 may be formed using any now known or later developed technique, e.g., deposition, epitaxial growth, etc.

FIGS. 5-10 show one embodiment of forming a monocrystalline emitter 136 (FIG. 10) over monocrystalline SiGe intrinsic base 130. In contrast to conventional processes, this process does not require a sacrificial emitter. FIG. 5 shows forming a hardmask 140 including, for example, a silicon oxide ($SiO_2$), silicon nitride ($Si_3N_4$) and silicon oxide ($SiO_2$) (ONO) layer 142, and a thicker silicon oxide ($SiO_2$) hardmask layer 144. FIG. 6 shows depositing and patterning a resist 150, and then etching 152 to form an opening 154 to ONO layer 142. Etching 152 may include, for example, a reactive ion etch or a wet etch. FIG. 7 shows removing resist 150 (FIG. 6), and removal of ONO layer 142 in opening 154 to monocrystalline SiGe intrinsic base 130, e.g., by a wet etch and clean.

Figure 9:
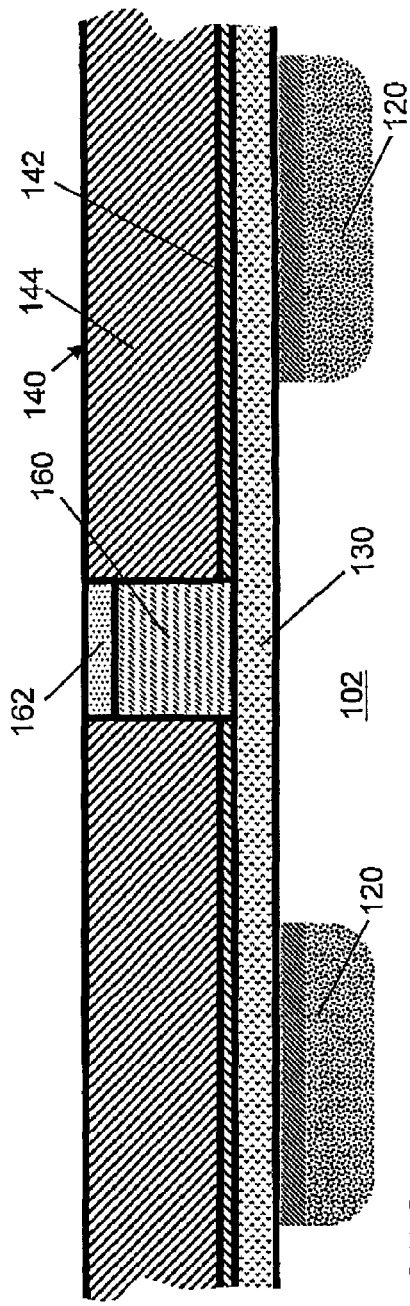
Figure 10:
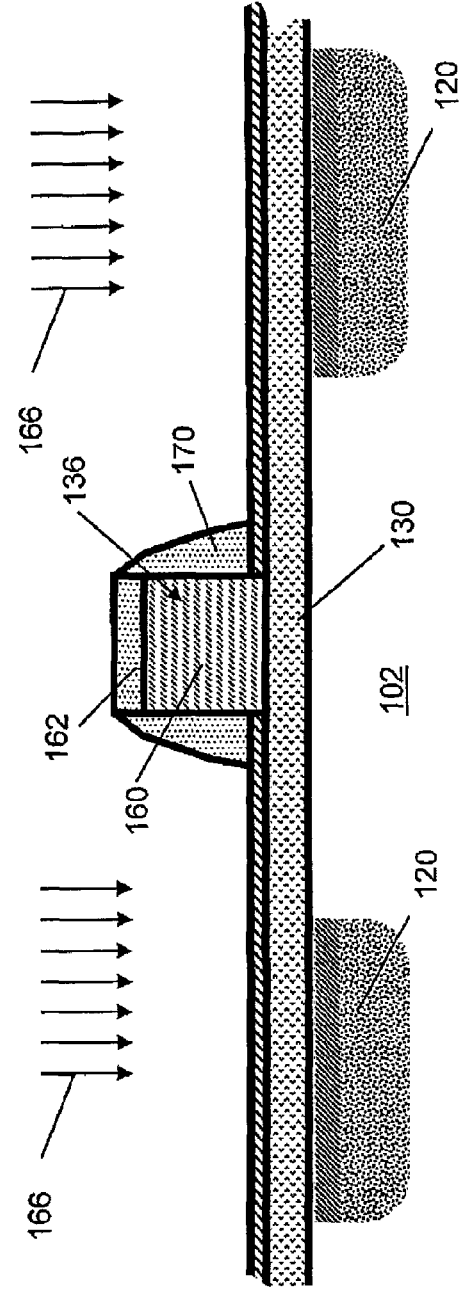

Next, FIG. 8 shows forming monocrystalline silicon 160, e.g., by selective epitaxial growth, in opening 154 (FIG. 7). Monocrystalline silicon 160 may form in a substantially mushroom shape. Subsequently, as shown in FIG. 9, monocrystalline silicon 160 can be planarized, e.g., by chemical mechanical polishing (CMP), and recessed (e.g., by RIE). A cap 162 (e.g., of silicon nitride ($Si_3N_4$)) can then be formed by, for example, depositing a capping layer (not shown) and planarizing via CMP. FIG. 10 shows etching 166 (e.g., RIE) to remove thicker $SiO_2$ hardmask layer 144 (FIG. 9) and formation of a spacer 170 (e.g., $Si_3N_4$) to protect emitter 136 formed from monocrystalline silicon 160 (FIG. 9). It is understood that FIGS. 5-10 show one embodiment of forming monocrystalline emitter 136, and that other processes may also be possible. For example, monocrystalline emitter 136 may include an implanted or in-situ doped monocrystalline material, e.g., silicon or SiGe.

Figure 11:
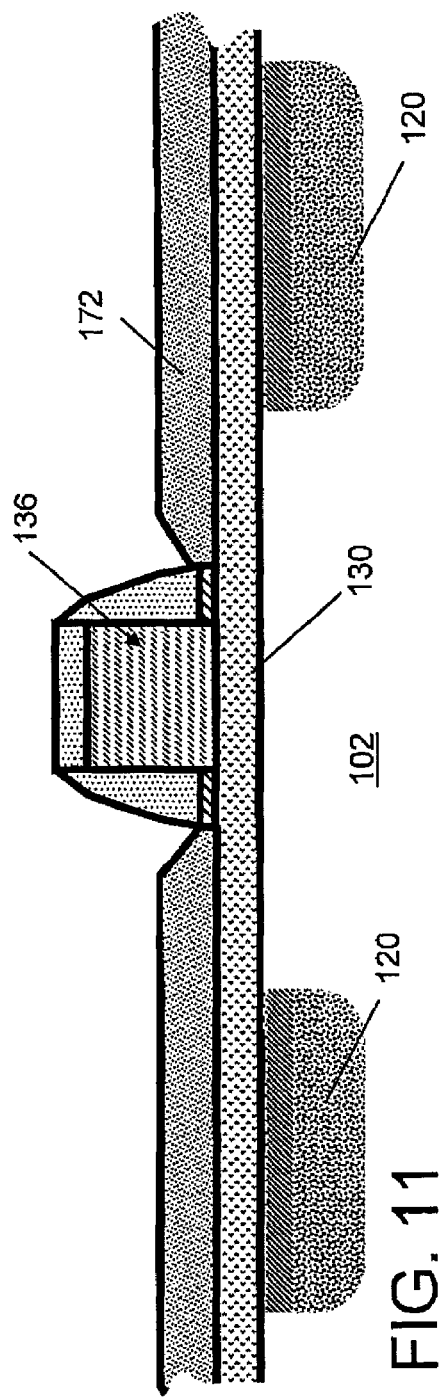

FIG. 11 shows forming a monocrystalline extrinsic base 172 over monocrystalline SiGe intrinsic base 130 after ONO layer 142 (FIG. 9) removal, e.g., via RIE or a wet etch. In contrast to conventional processing, however, an area in which monocrystalline extrinsic base 172 is to be formed includes monocrystalline SiGe intrinsic base 130. As a result, monocrystalline extrinsic base 172 may be formed, for example, by epitaxial growing monocrystalline silicon on monocrystalline SiGe intrinsic base 130. Monocrystalline extrinsic base 172 may be either grown non-selectively or selectively, as shown. As a result, selective epitaxy may be used to grow emitter 136, intrinsic base 130 and extrinsic base 172, self-aligned to each other. However, the base-emitter combination is not self-aligned to isolation regions 106 (FIG. 17), as described herein.

Figure 12:
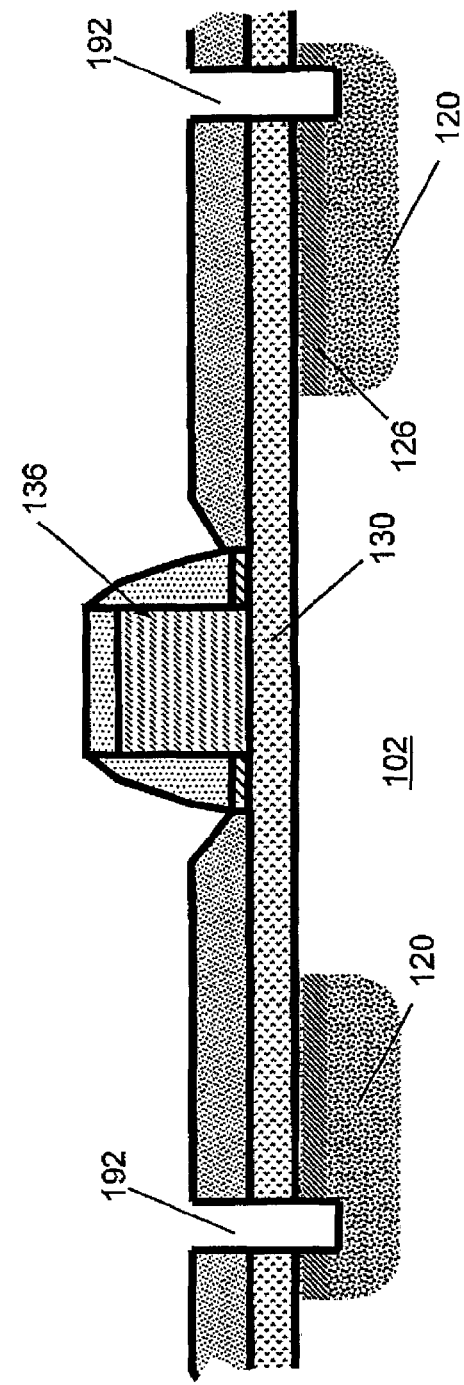

As shown in FIG. 12, before silicidation and other back-end-of-line processing, an opening 192 is formed through on an outer perimeter, e.g., using a patterned hardmask and timed RIE. The depth of opening 192 is relatively non-critical so long as it reaches implanted porous silicon region 120.

FIG. 13 shows one embodiment of converting implanted porous silicon region 120 (FIG. 12) to an isolation region 106 (FIGS. 14-17). In the embodiment shown, a low temperature oxidation (LTO) 145 (e.g., approximately 400° C.) of implanted porous silicon region 120 is performed to convert implanted porous silicon region 120 to a dielectric, e.g., silicon oxide ($SiO_2$), hence, forming isolation region 106.

Figure 15:
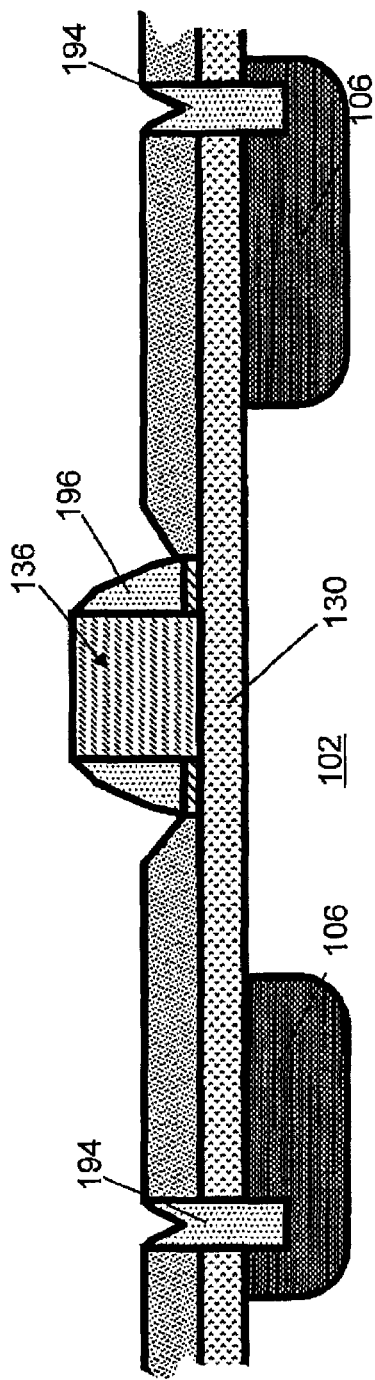
Figure 16:
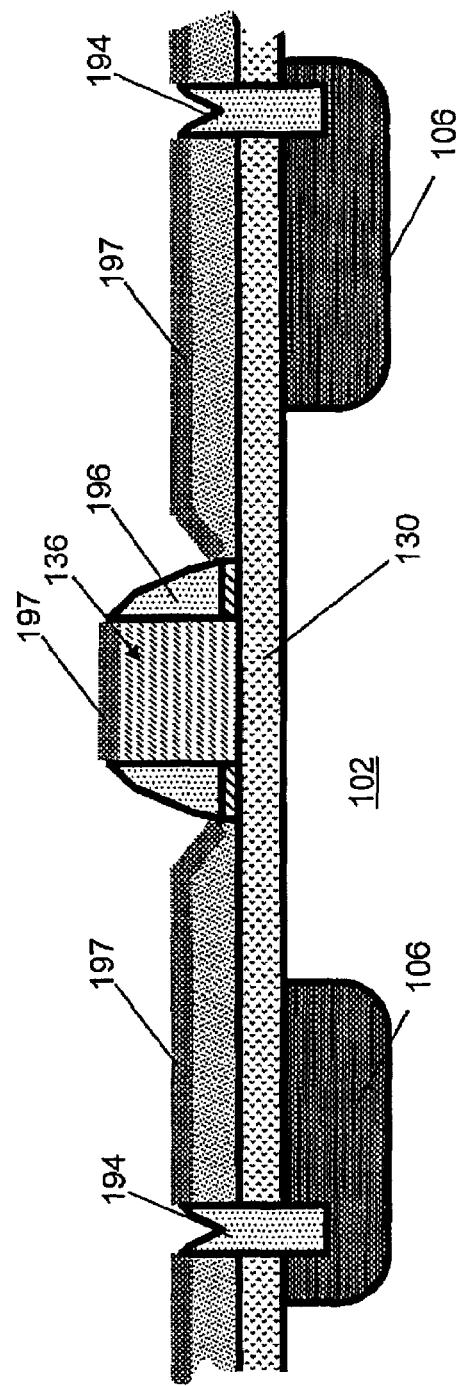

FIGS. 14-17 show further processes to finalize HBT 100 (FIG. 17). FIG. 14 shows removal of spacer 170 (FIG. 13) and cap layer 162 (FIG. 10), e.g., by RIE. FIG. 15 shows capping of isolation region 106, e.g., with a plug 194 of dielectric material such as silicon nitride ($Si_3N_4$), and re-formation of a spacer 196 about emitter 136. FIG. 16 shows forming silicide 197 using any now known or later developed salicidation process. FIG. 17 shows an optional embodiment of forming an outer spacer 198, e.g., of silicon nitride ($Si_3N_4$), about spacer 196, hence forming a double spacer about monocrystalline emitter 136. Outer spacer 198 extends over a portion 199 of monocrystalline extrinsic base 172. Double spacers 196, 198 may be helpful for landing the first BEOL via etch on emitter 136 without shorting to base 130, 172.

Figure 18:
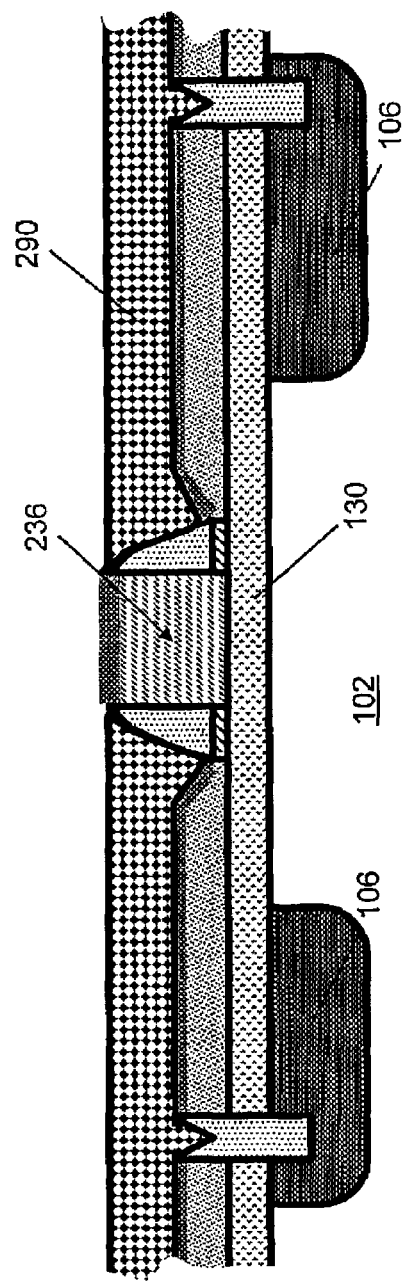
FIGS. 18-20 show one alternative embodiment of the method.
Figure 19:
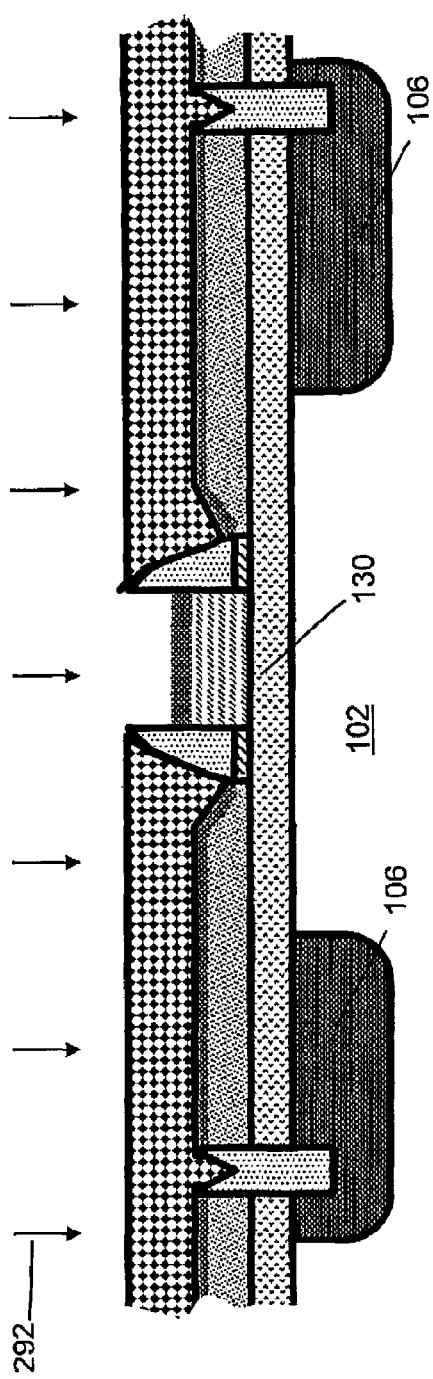
Figure 20:
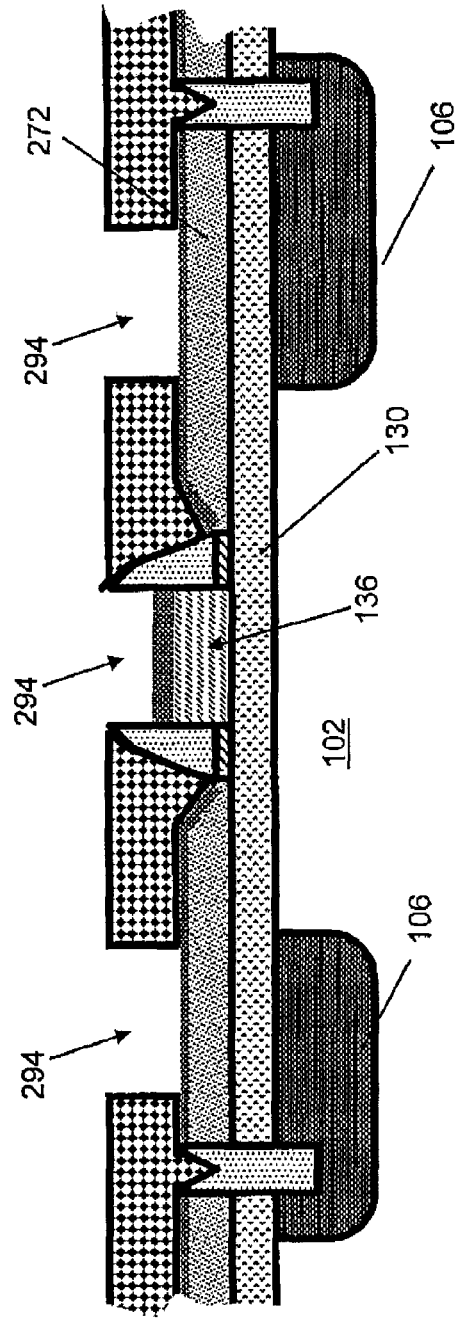

FIGS. 18-20 show an alternative embodiment in which monocrystalline emitter 236 is recessed so as to be more co-planar with monocrystalline extrinsic base 272 (FIG. 20). Conventionally, this process would not be possible because a sacrificial emitter is used rather than a monocrystalline emitter 236 because exposing the actual emitter to the necessary etching and polishing processes is too damaging to the emitter. In this case, monocrystalline emitter 236 allows recessing. This embodiment may start at the structure shown in FIG. 16. In this case, as shown in FIG. 18, a low-temperature oxide 290 is deposited and polished and recessed to the top of emitter 236. FIG. 19 shows a silicide RIE 292 to recess emitter 236 and re-silicidation, which ensure a low-resistance emitter 236. Subsequently, as shown in FIG. 20, low-temperature oxide 290 may be patterned and etched so that via forming openings 294 may be formed. This process allows formation of vias (not shown) to monocrystalline extrinsic base 272 and emitter 236, eliminating the need for a wide landing spacer.

FIGS. 21-29 show various alternative embodiments of the method that employ a buried porous silicon region 220. In this case, as shown in FIG. 21, a substrate 202 is provided, and an implanted region 204 is formed by ion implanting 216 (e.g., boron (B)) at a location to be isolation region 206 (FIG. 25) such that an upper surface 210 of implanted region 204 is distanced from a surface 212 of substrate 202, i.e., implanted region 204 and porous silicon region 220 are buried. Surface 212 is capable of having monocrystalline silicon formed thereon. In this case, implanted region 204 includes the monocrystalline silicon (not doped) of substrate 202. Implanted region 204 may be formed, for example, by forming a mask 213 and patterning/etching to form an opening 214 therein, and then ion implanting 216. The dopant implanted may include, for example, boron (B).

FIG. 22 shows removing mask 213 (FIG. 21) and performing an anodic porousification 218 on implanted region 204 (FIG. 21) to create implanted porous silicon regions 220. The mask removal may include any conventional resist stripping technique, e.g., wet etching. Anodic porousification 218 may include performing a hydrofluoric acid bath using low current densities, e.g., approximately 1-10 mA/cm$^2$. In this case, anodic porousification 218 porosifies surface 212 but not to the extent of implanted region 204 (FIG. 21).

Figure 23:
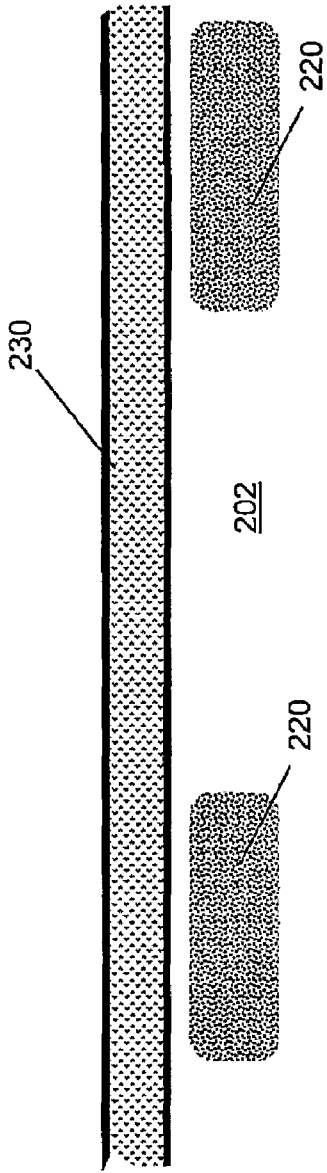

FIG. 23 shows forming a monocrystalline silicon germanium (SiGe) intrinsic base 230 over implanted porous silicon region 220 and substrate 202. This process may be preceded by patterning a hardmask (not shown). In any event, in contrast to conventional processes, monocrystalline SiGe intrinsic base 230 is substantially uniform in thickness and substantially continuous, even over implanted porous silicon region 220. In addition, monocrystalline SiGe intrinsic base 230 is monocrystalline SiGe over implanted porous silicon region 220, which will eventually be converted to an isolation region 206 (FIG. 25).

Figure 24:
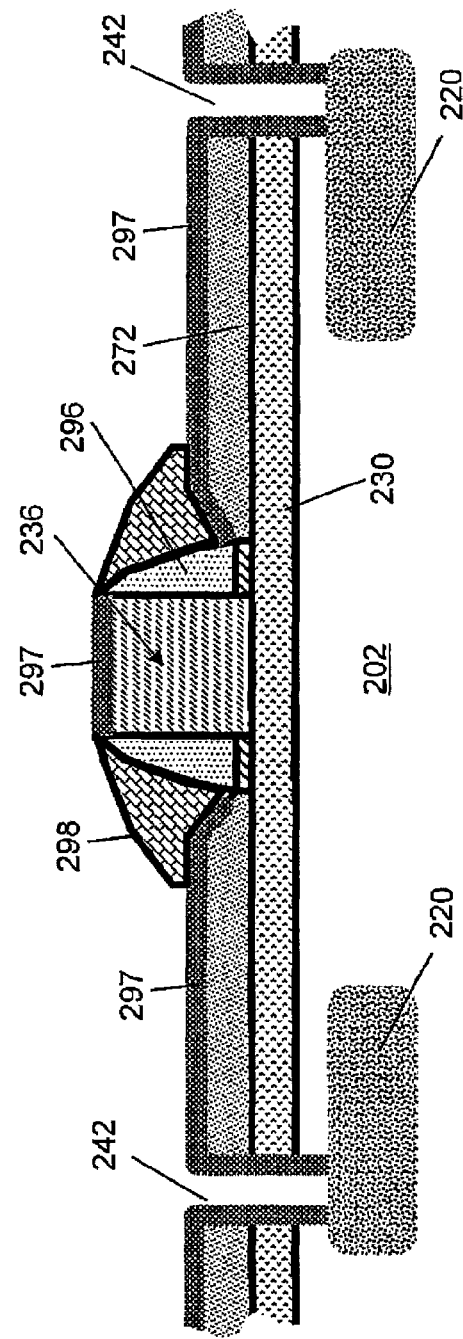
Figure 29:
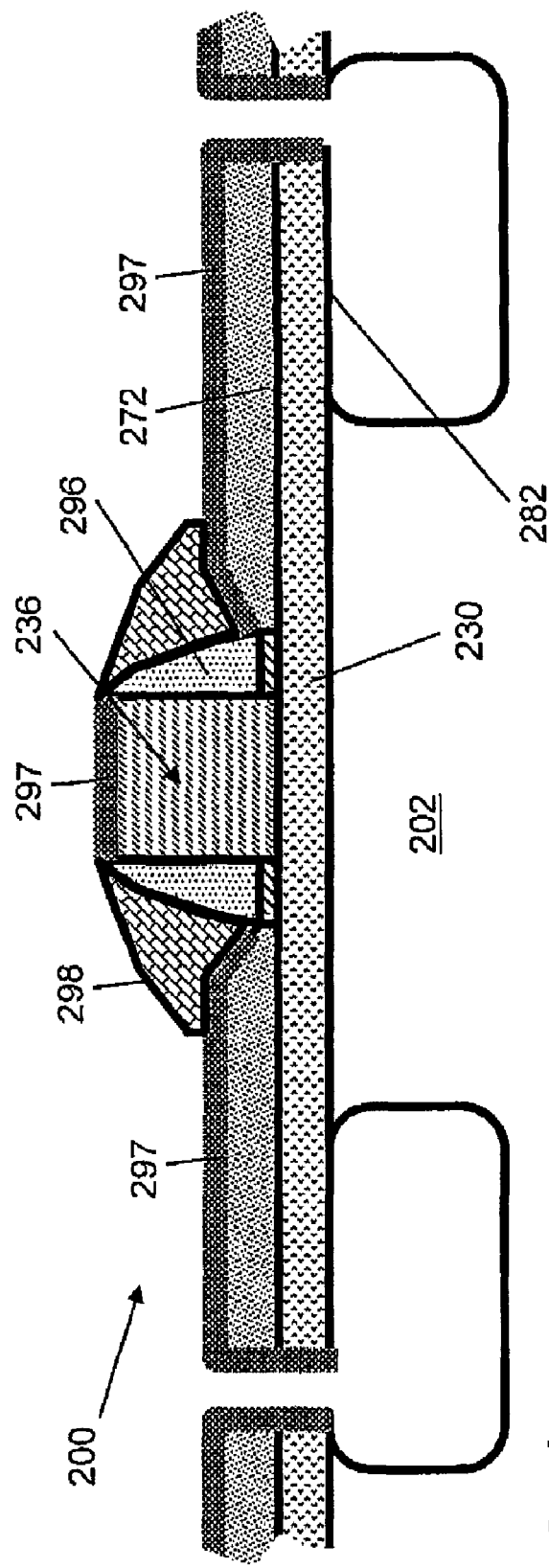
FIG. 29 shows another alternative embodiment of the method.

As shown in FIG. 24, subsequent to this stage, processing may proceed as described herein relative to FIGS. 5-11 to form monocrystalline emitter 236 and monocrystalline extrinsic base 272. FIG. 24 also shows salicidation to form silicide 297, and formation of optional double spacer 296, 298. FIG. 24 further shows formation of openings 242 to porous silicon regions 220. In contrast to FIGS. 5-11, however, implanted porous silicon region 220 being buried (i.e., having surface 212) eliminates the need for a high-temperature skin formation (as in FIG. 3) after porousification 218, while maintaining chemical and structural stability for further processing. In addition, the omission of the high-temperature skin formation reduces the thermal budget of the integration process and helps maintain the porosity for selective removal or oxidation, as described herein.

As shown in FIG. 25, implanted porous silicon region 220 (FIG. 24) can be converted to an isolation region 206 using any of a variety of embodiments. FIG. 25 shows, for example, performing a low temperature oxidation 245 of implanted porous silicon region 220 to convert implanted porous silicon region 220 to a dielectric. FIGS. 26-27 show another embodiment of converting implanted porous silicon region 220 (FIG. 24) to isolation region 206 (FIG. 27). In this case, implanted porous silicon region 220 (FIG. 24) is removed via opening 242, e.g., by a collapsing etch to form void 250 (FIG. 26), and opening 242 is sealed to form isolation region 206 (FIG. 27) as a gas. As shown in FIG. 27, a plug 260, e.g., of silicon nitride ($Si_3N_4$) may be used to seal isolation region 206.

FIG. 28 shows another embodiment of converting implanted porous silicon region 220 (FIG. 24) to isolation region 206. In this embodiment, implanted porous silicon region 220 (FIG. 24) is removed via opening 242, e.g., by a collapsing etch, as shown in FIG. 26, to form void 250. In this case, however, void 250 is passivated, e.g., by deposition of a dielectric 252 (e.g., silicon oxide ($SiO_2$)) in void 250, and at least a portion of void 250 is re-filled with a dielectric 254 (e.g., silicon oxide ($SiO_2$)). As shown in FIG. 28, a plug 260 of passivation dielectric 252 may be used to seal isolation region 206.

In the above-described embodiments of FIGS. 26-28, undesired electrical effects of the remainder of the porous material on the sidewall of collector 238 (FIG. 28) (such as charge trapping, carrier scattering, increased recombination etc.) can be mitigated by a brief and shallow isotropic bulk silicon (Si) etch. Any remaining processing (i.e., back end of the line) proceeds as now known or later developed to finalize HBT 200 (FIGS. 27 and 28). Furthermore, in one alternative embodiment, shown in FIG. 29, prior to sealing isolation region 206 (FIG. 26) as in FIG. 27 or passivating/refilling as in FIG. 28, a portion 280 (FIG. 28 only) of substrate 202 above void 250 (FIG. 26) may be removed, e.g., by a shallow isotropic silicon etch, to a lower surface 282 (FIG. 29) of monocrystalline intrinsic base 230. Processing may then proceed as described relative to FIGS. 26-27 or 28. Any remaining processing (i.e., back end of the line) occurs as now known or later developed to finalize HBT 200 (FIGS. 25 and 27-29).

In any event, as shown in FIGS. 17, 25 and 27-29, the above-described methods result in a heterostructure bipolar transistor (HBT) 100, 200 including: substrate 102, 202, a monocrystalline emitter 136, 236, a collector 138, 238 in substrate 102, 202, at least one isolation region 106, 206 adjacent to collector 138, 238, a monocrystalline SiGe intrinsic base 130, 230 extending over each isolation region 106, 206, and a monocrystalline silicon extrinsic base 172, 272. Each isolation region 106, 206 may include a plug 160, 260, sealing isolation region 106, 206 from an above layer. In some embodiments (FIG. 27), isolation region 106, 206 includes a gas dielectric.

HBT 100, 200 exhibit a number of advantages. For example, HBT 100, 200 exhibit reduced collector-base capacitance ($C_{cb}$) and base resistance ($R_b$), and is almost completely self-aligned. In particular, employing sacrificial implanted porous silicon region 120, 220 enables the subsequent highly-selective removal from under the built device, greatly reducing the capacitance between the base and collector. In addition, the methodology described herein allows for a self-aligned extrinsic base 172, 272 depositions facilitating the integration process, and minimizing parasitic capacitances. The mobility of monocrystalline silicon is inherently larger than that of equally doped polysilicon or amorphous material. Hence, a monocrystalline SiGe intrinsic base 130, 230 has a lower resistance. Since monocrystalline SiGe intrinsic base 130, 230 forms as a continuous layer, by definition of epitaxy, a better link and bulk resistance can be achieved, compared to a discontinuous layer of conventional processes. The germanium (Ge) in the monocrystalline SiGe intrinsic base 130, 230 causes biaxial strain that further increases lateral hole mobility and helps lower the base resistance.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A heterostructure bipolar transistor (HBT) comprising:
   a substrate;
   a monocrystalline emitter atop the substrate;
   a collector in the substrate;
   at least one isolation region adjacent to the collector;
   a monocrystalline silicon germanium (SiGe) intrinsic base extending over each isolation region, the monocrystalline SiGe intrinsic base directly contacting an upper surface of the at least one isolation region; and
   a monocrystalline silicon extrinsic base.

2. The HBT of claim 1, wherein each isolation region includes a plug sealing the isolation region from an above layer.

3. The HBT of claim 1, wherein the at least one isolation region includes silicon oxide or a gas.

4. The HBT of claim 1, further comprising a double spacer about the monocrystalline emitter.

5. The HBT of claim 4, wherein an outer spacer of the double spacer extends over a portion of the monocrystalline extrinsic base.

* * * * *